United States Patent
Nguyen

(10) Patent No.: US 7,439,789 B2
(45) Date of Patent: Oct. 21, 2008

(54) SYSTEMS AND METHODS FOR CONTROLLING TERMINATION RESISTANCE VALUES FOR A PLURALITY OF COMMUNICATION CHANNELS

(75) Inventor: Huy M. Nguyen, San Jose, CA (US)

(73) Assignee: Rambus Inc., Los Altos, CA (US)

( * ) Notice: Subject to any disclaimer, the term of this patent is extended or adjusted under 35 U.S.C. 154(b) by 0 days.

(21) Appl. No.: 11/715,140

(22) Filed: Mar. 7, 2007

(65) Prior Publication Data

US 2007/0159228 A1    Jul. 12, 2007

Related U.S. Application Data

(62) Division of application No. 11/018,163, filed on Dec. 20, 2004, now Pat. No. 7,196,567.

(51) Int. Cl.
   *H03L 5/00* (2006.01)
(52) U.S. Cl. .................... 327/308; 326/30
(58) Field of Classification Search ............. 327/308; 326/30
   See application file for complete search history.

(56) References Cited

U.S. PATENT DOCUMENTS

| | | | |
|---|---|---|---|
| 4,513,427 A | 4/1985 | Borriello et al. | |
| 5,254,883 A | 10/1993 | Horowitz et al. | |
| 5,298,800 A | 3/1994 | Dunlop et al. | |
| 5,396,028 A | 3/1995 | Tomassetti | |
| 5,467,455 A | 11/1995 | Gay | 395/281 |

(Continued)

FOREIGN PATENT DOCUMENTS

JP    02140676    5/1990

(Continued)

OTHER PUBLICATIONS

Janzen, Jeff, "DDR2 Offers New Features and Functionality," Designline, vol. 12, Issue 2, Micron, 16 pages, Jul. 31, 2003 EN.L.

(Continued)

*Primary Examiner*—Kenneth B. Wells
(74) *Attorney, Agent, or Firm*—Silicon Edge Law Group LLP; Arthur J. Behiel

(57) ABSTRACT

Described are controllable termination impedances that may be adjusted collectively by a combination of digital and analog signals. Each adjustable impedance, responsive to the digital signals, establishes a gross termination resistance for one of a plurality of communication channels by enabling one or more of a plurality of parallel-coupled impedance legs. Each leg includes at least one transistor for controlling the impedance of the leg over a continuous range. An analog compensation voltage is level shifted and the resulting level-shifted signal is applied to the control terminals of the transistors of the selected impedance legs. The compensation voltage, and consequently the level-shifted signal, varies with supply-voltage and temperature fluctuations in a manner that causes the collective impedance of the selected legs for each channel to remain stable despite the fluctuations. The combination of digital and analog impedance control provides for coarse impedance adjustments, such as to compensate for process variations, and additionally provides fine, adaptive adjustments to maintain the selected impedance despite changes in the supply voltage and temperature.

15 Claims, 7 Drawing Sheets

U.S. PATENT DOCUMENTS

| | | | | |
|---|---|---|---|---|
| 5,606,275 | A | | 2/1997 | Farhang et al. ............... 327/108 |
| 5,663,661 | A | | 9/1997 | Dillon ......................... 326/30 |
| 5,666,078 | A | | 9/1997 | Lamphier ................... 327/108 |
| 5,680,060 | A | | 10/1997 | Banniza et al. |
| 5,726,582 | A | * | 3/1998 | Hedberg ....................... 326/30 |
| 5,793,223 | A | * | 8/1998 | Frankeny ...................... 326/30 |
| 5,926,031 | A | | 7/1999 | Wallace et al. |
| 5,969,658 | A | | 10/1999 | Naylor |
| 5,995,894 | A | | 11/1999 | Wendte ........................ 701/50 |
| 6,028,484 | A | | 2/2000 | Cole et al. |
| 6,052,035 | A | * | 4/2000 | Nolan et al. .................... 331/74 |
| 6,060,907 | A | | 5/2000 | Vishwanthaiah et al. |
| 6,064,224 | A | | 5/2000 | Esch, Jr. et al. |
| 6,084,424 | A | * | 7/2000 | Gasparik ...................... 326/30 |
| 6,157,206 | A | | 12/2000 | Taylor ......................... 326/30 |
| 6,188,237 | B1 | * | 2/2001 | Suzuki et al. .................. 326/30 |
| 6,266,001 | B1 | | 7/2001 | Fang et al. |
| 6,288,564 | B1 | * | 9/2001 | Hedberg ....................... 326/30 |
| 6,291,881 | B1 | | 9/2001 | Yang |
| 6,297,759 | B1 | | 10/2001 | Lewyn |
| 6,308,232 | B1 | | 10/2001 | Gasbarro ..................... 710/100 |
| 6,330,193 | B1 | | 12/2001 | Yu et al. |
| 6,344,765 | B2 | | 2/2002 | Taguchi |
| 6,356,105 | B1 | | 3/2002 | Volk ........................... 326/30 |
| 6,356,106 | B1 | | 3/2002 | Greeff ......................... 326/30 |
| 6,356,141 | B1 | * | 3/2002 | Yamauchi .................... 327/543 |
| 6,411,122 | B1 | | 6/2002 | Mughal et al. |
| 6,414,512 | B1 | * | 7/2002 | Moyer ......................... 326/30 |
| 6,418,500 | B1 | | 7/2002 | Gai et al. |
| 6,424,170 | B1 | | 7/2002 | Raman et al. |
| 6,442,644 | B1 | | 8/2002 | Gustavson et al. |
| 6,448,813 | B2 | | 9/2002 | Garlepp et al. |
| 6,462,591 | B2 | | 10/2002 | Garrett, Jr. et al. |
| 6,467,013 | B1 | | 10/2002 | Nizar |
| 6,495,997 | B2 | * | 12/2002 | Hall et al. .................... 323/316 |
| 6,509,756 | B1 | | 1/2003 | Yu et al. |
| 6,511,901 | B1 | | 1/2003 | Lam et al. |
| 6,525,558 | B2 | * | 2/2003 | Kim et al. ..................... 326/30 |
| 6,530,062 | B1 | | 3/2003 | Liaw et al. |
| 6,531,784 | B1 | | 3/2003 | Shim et al. |
| 6,545,522 | B2 | | 4/2003 | Mughal et al. |
| 6,573,746 | B2 | | 6/2003 | Kim et al. |
| 6,573,747 | B2 | | 6/2003 | Radhakrishnan |
| 6,586,964 | B1 | * | 7/2003 | Kent et al. .................... 326/30 |
| 6,597,298 | B2 | | 7/2003 | Kim et al. |
| 6,606,004 | B2 | | 8/2003 | Staszewski et al. |
| 6,608,507 | B2 | | 8/2003 | Garrett, Jr. et al. |
| 6,643,787 | B1 | | 11/2003 | Zerbe et al. |
| 6,661,250 | B2 | | 12/2003 | Kim et al. |
| 6,711,073 | B2 | | 3/2004 | Martin |
| 6,734,702 | B1 | | 5/2004 | Ikeoku et al. |
| 6,756,812 | B2 | * | 6/2004 | Nagano et al. ................ 326/60 |
| 6,762,620 | B2 | | 7/2004 | Jang et al. |
| 6,768,352 | B1 | | 7/2004 | Maher et al. |
| 6,781,405 | B2 | | 8/2004 | Best ........................... 326/30 |
| 6,781,416 | B1 | | 8/2004 | Nguyen et al. |
| 6,806,728 | B2 | | 10/2004 | Nguyen et al. |
| 6,836,170 | B2 | * | 12/2004 | Kitagawa et al. ............. 327/308 |
| 6,856,169 | B2 | | 2/2005 | Frans .......................... 326/82 |
| 6,894,691 | B2 | | 5/2005 | Juenger ...................... 345/531 |
| 6,911,875 | B2 | * | 6/2005 | Lee et al. .................... 333/17.3 |
| 6,924,660 | B2 | | 8/2005 | Nguyen ....................... 326/30 |
| 6,940,303 | B2 | | 9/2005 | Vargas |
| 6,956,413 | B2 | * | 10/2005 | Bailey ........................ 327/131 |
| 6,965,529 | B2 | | 11/2005 | Zumkeher ............. 365/189.05 |
| 6,980,020 | B2 | | 12/2005 | Best |
| 7,102,200 | B2 | | 9/2006 | Fan ............................. 257/379 |
| 7,123,047 | B2 | | 10/2006 | Lim ............................ 326/30 |
| 7,148,721 | B2 | | 12/2006 | Park ........................... 326/30 |
| 2001/0047450 | A1 | | 11/2001 | Gillingham et al. |
| 2002/0141896 | A1 | | 10/2002 | Komazaki et al. |
| 2004/0124850 | A1 | | 7/2004 | Koneru |
| 2004/0201402 | A1 | | 10/2004 | Rajan .......................... 326/30 |
| 2005/0041683 | A1 | | 2/2005 | Kizer |
| 2005/0052200 | A1 | | 3/2005 | Nguyen et al. |
| 2005/0057275 | A1 | | 3/2005 | Nguyen et al. |
| 2005/0057278 | A1 | | 3/2005 | Nguyen et al. |
| 2006/0007761 | A1 | | 1/2006 | Ware .......................... 365/194 |
| 2006/0071683 | A1 | | 4/2006 | Best ............................ 326/30 |
| 2006/0077731 | A1 | | 4/2006 | Ware .......................... 365/194 |

FOREIGN PATENT DOCUMENTS

| | | |
|---|---|---|
| WO | WO 97/02658 | 1/1997 |
| WO | WO 98/04041 | 1/1998 |
| WO | WO 00/41300 | 7/2000 |
| WO | WO 00/70474 | 11/2000 |
| WO | WO 2004/061690 | 7/2004 |

OTHER PUBLICATIONS

Micron Technical Note, "DDR2-533 Memory Design Guide for Two-DIMM Unbuffered Systems," TN-47-01, 2003, 19 pages.

DDR2 ODT Control; Product Planning & Application Engineering Team, Dec. 2004, pp. 8.

U.S. Appl. No. 11/018,163, filed Dec. 2004, Nguyen.

U.S. Appl. No. 11/176,876, filed Jul. 2005, Nguyen.

U.S. Appl. No. 11/100,949, filed Apr. 2005, Nguyen.

Gabara, Thaddeus J. et al. "A 200 MHz 100K ECL Output Buffer for CMOS ASICs." 1990 IEEE. p. 4.

Gabara, Thaddeus J., "On-Chip Terminating Resistors for High Speed ECL-CMOS Interfaces." Feb. 1992. IEEE. pp. 292-295.

Knight, Thomas F. Jr., "A Self-Terminating Low-Voltage Swing CMOS Output Driver." IEEE Journal of Solid-State Circuits, vol. 23, No. 2, Apr. 1988. pp. 457-464.

Gabara, Thaddeus J., "Digitally Adjustable Resistors in CMOS for High-Performance Applications." IEEE Journal of Solid-State Circuits, vol. 27, No. 8, Aug. 1992, pp. 1176-1211.

Babcock, J.A., "Precision Electrical Trimming of Very Low TCR Poly-SiGe Resistors." IEEE Electron Device Letters, vol. 21, No. 6, Jun. 2000, pp. 283-285.

Shah, Sunay et al., "A Temperature Independent Trimmable Current Source." Department of Engineering Science, University of Oxford. ISCAS 2002. 4 pages.

Kim, Su-Chul, "Programmable Digital On-Chip Terminator." ITC-CSCC, 2002. 4 pages.

Johnson, Chris. "The Future of Memory: Grahphics DDR3 SDRAM Functionality." Micron Designline, vol. 11, Issue 4, 4Q02. 8 pages, 2002.

Al-Sarawi, Said F. et al. "A Review of 3-D Packaging Technology." IEEE Transactions on Components, Packaging, and Manufacturing Technology-PartB, vol. 21, No. 1, Feb. 1998.

Ko, Hyoung-Soo et al., "Development of 3-Dimensional Memory Die Stack Packages Using Plymer Insulated Sidewall Technique." IEEE Electronic Components and Technology Conference, 1999.

"400 Mb/s/pin SLDRAM Draft/Advance, 4M×18 SLDRAM-Pipeline, Eight Bank, 2.5V Operation." Copyright 1998, SLDRAM Inc. 69 pages.

Ware, Frederick A., "Direct RAC Data Sheet" Advance Information. Document DL0064, Version 1.11. Copyright Jul. 2000, Rambus Inc. 66 pages.

"Hastings Rambus Asic Cell Specification Generic Implementation, Revision 0.1 Preliminary." Copyright 1999 Rambus Inc. Modified Jun. 20, 2003 149 pgs.

Khouri, Gaby, "Evaluation of Alcatel Patent Portfolio by Semiconductor Insights." Nov. 2004. Copyright Semiconductor Insights Inc. 38 pages.

"Micron Graphics DDR3 DRAM." Advance. Copyright 2003 Micron Technology, Inc. 67 pages.

Nakase, Yasunobu, et al. "Source-Synchronization and Timing Vernier Techniques for 1.2-GB/s SLDRAM Interface." IEEE Journal of Solid-State Circuits, vol. 34, No. 4, 1999.

Gillingham, Peter. "SLDRAM Architectural and Functional Overview." Copyright Aug. 29, 1997 SLDRAM Consortium. 14 pages.

Lluis, Paris. "WP 24.3: An 800MB/s 72Mb SLDRAM with Digitally-Calibrated DLL." 1999 ISSCC Slide Supplement. 2 pages.

"Intel 430 TX PCISET: 82439TX System Controller (MTXC)"—Preliminary. Order #290559-001. Copyright Feb. 1997 Intel Corporation. 83 pages.

Johnson, Chris. "Graphics DDRS On-Die Termination and Thermal Considerations." Micron Designline, vol. 12, Issue 1, 1Q03/2Q03. 8 pages, 2003.

* cited by examiner

SYSTEMS AND METHODS FOR CONTROLLING TERMINATION RESISTANCE VALUES FOR A PLURALITY OF COMMUNICATION CHANNELS

BACKGROUND

Many high-speed integrated circuit (IC) applications require precise, accurate, and stable resistance values. Unfortunately, typical integrated resistors suffer from doping and geometrical errors that result in variations of ten or twenty percent from the designated value. To make matter worse, resistor values can vary significantly with changes in supply voltage and temperature. These problems are often addressed by the inclusion of external precision resistors, but their use increases cost and complexity. There is therefore a need for precise, accurate, and stable resistances that can be reliably fabricated using conventional IC processes.

DETAILED DESCRIPTION

Figure 1:
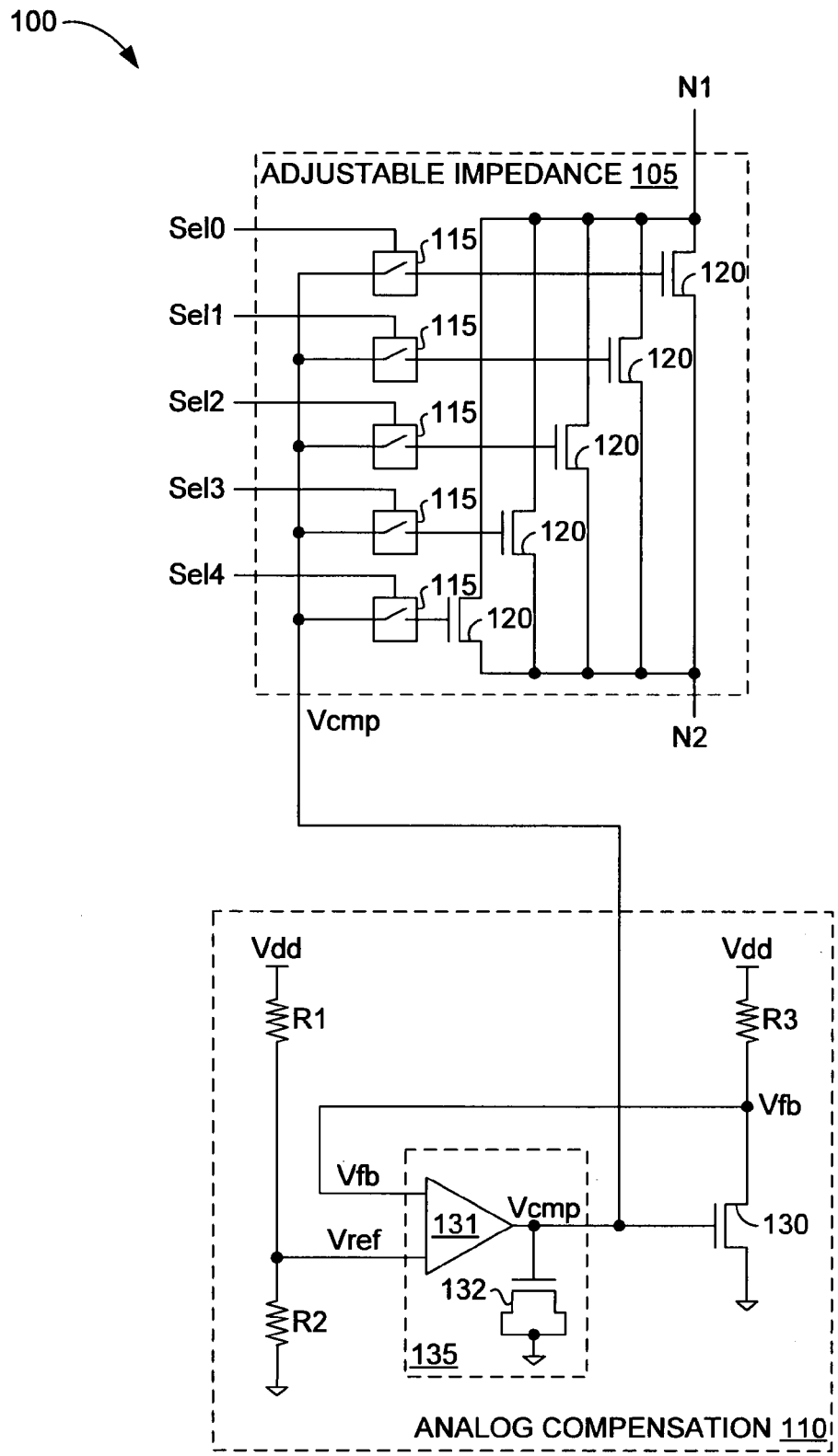
FIG. 1 depicts a controllable resistance 100 in accordance with one embodiment.

FIG. 1 depicts a controllable resistance 100 in accordance with one embodiment. Resistance 100, which might also be termed an "impedance" or a "termination," includes adjustable impedance 105 and analog compensation circuitry 110. Adjustable impedance 105 establishes a gross resistance between nodes N1 and N2 in response to digital select signals Sel[0:4] that close corresponding switches 115 (e.g., transistors, transmission gates, or logic gates) to turn on one or more of a plurality of parallel-coupled transistors 120, each of which controls the current flow through one of five parallel impedance legs of impedance 105. The gate voltage of the selected ones of transistors 120 is an analog compensation voltage Vcmp that varies with supply-voltage and temperature fluctuations in a manner that offsets changes to the on resistance of the selected transistors that would otherwise occur. Compensation voltage Vcmp would decrease (increase), tending to increase (decrease) the on resistance of selected transistors 120, in response to voltage or temperature changes that tend to decrease (increase) on resistance. This combination of digital and analog resistance control provides for coarse resistance adjustments over a considerable range, such as to compensate for process variations, and additionally provides fine, adaptive adjustments to maintain a selected resistance despite changes in the supply voltage and temperature. The coarse resistance adjustments can be used, for example, at system initialization to establish a desired impedance, while the analog resistance control can be applied continuously thereafter to maintain a relatively stable impedance despite changes in supply voltage and temperature.

Compensation circuitry 110 includes two voltage dividers, each of which is coupled between supply terminals Vdd and ground. The first voltage divider, made up of resistors R1 and R2, develops a reference voltage Vref. The second voltage divider, a feedback leg made up of a resistor R3 and a transistor 130, develops a feedback signal Vfb. An integrator 135, including a comparator 131 and a capacitively coupled transistor 132 in this example, controls compensation voltage Vcmp on the gate of transistor 130 to maintain feedback voltage Vfb equal to reference voltage Vref.

Although the reference and feedback voltages may be developed in any number of ways, in the depicted example, resistors R1, R2, and R3 are fabricated together, are of the same specified value, and are relatively close to one another on the die. The values of these resistors may therefore be expected to be fairly similar. The resistance across transistor 130 must therefore be the same as the value of resistor R2 for voltages Vref and Vfb to remain equal. Compensation voltage Vcmp is therefore the gate voltage for transistor 130 required to maintain the resistance of transistor 130 equal to the value of resistor R2.

The values of resistors R1, R2, and R3 can be expected to vary considerably due to process variations, and to a lesser extent due to supply voltage and temperature changes. The ratio of the values of R1 and R2 should not change appreciably, however, so reference voltage Vref, and by extension feedback voltage Vfb, can be expected to be a fixed fraction of supply voltage Vdd. Changes in the supply voltage are therefore felt equally at both input terminals of comparator 131, and are consequently ignored. Compensation circuitry 110 will therefore fix the resistance through transistors 130 at the value of resistor R2, irrespective of supply fluctuations. The on resistance of transistor 130 will drift during operation with changes in the value of resistor R2, but such changes are small relative to resistance changes that would occur across transistor 130 absent compensation.

Transistors 120 and 130 may be fabricated at the same time, using the same process, and of the same gate length. The manner in which transistors 120 drift with temperature and voltage can therefore be expected to be similar to the manner in which transistor 130 drifts (i.e., transistors 120 and 130 exhibit similar impedance responses to temperature and voltage fluctuations). The compensation voltage Vcmp applied to the gate of transistor 130 to maintain the resistance of transistor 130 equal to resistor R2 therefore compensates for the effects of similar voltage and temperature variations on whichever of transistors 120 are selected. Compensation voltage Vcmp therefore stabilizes the resistance between nodes N1 and N2.

The five select bits Sel[0:4] can be set to achieve a desired resistance (e.g., 50 Ohms), or a desired result (e.g., a desired amplification factor, voltage drop, current level, or bit-error rate). Asserting select signals Sel0 and Sel1 to close the associated switches 115 would, for example, apply compensation voltage Vcmp to the gates of the two top-most transistors 120. The widths of transistors 120 can be binary coded, thermometer coded, etc., and more or fewer transistors can be provided to adjust the granularity and range of selectable resistance values.

Figure 2:
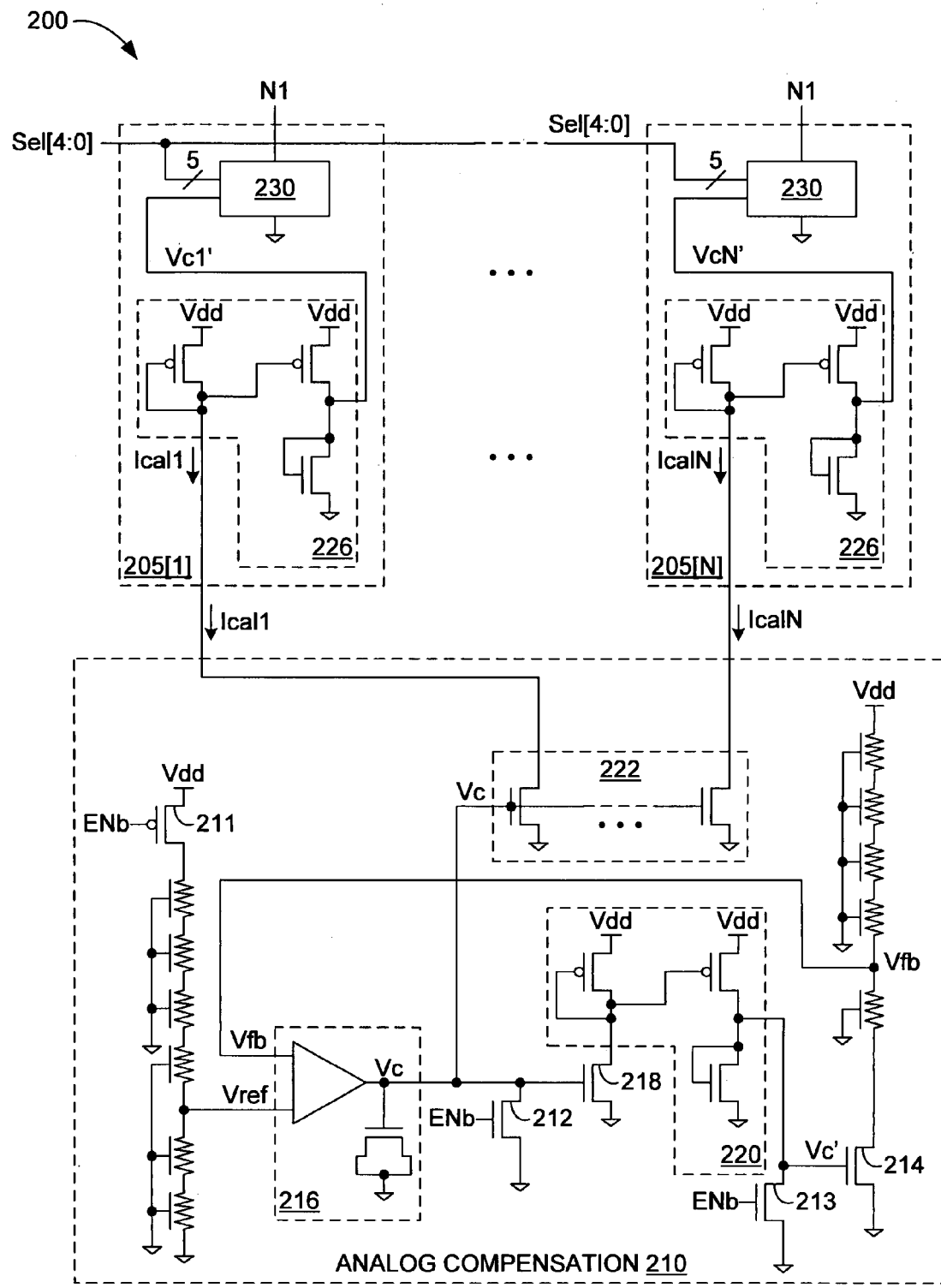
FIG. 2 depicts a system 200 of N compensated resistors 205[1:N] and an analog compensation circuit 210.

FIG. 2 depicts a system 200 of N compensated resistors 205[1:N] and an analog compensation circuit 210. System 200 is in many ways similar to system 100 of FIG. 1, but includes additional circuitry that improves performance and facilitates sharing of one compensation circuit among a plurality of compensated resistors. Each of resistors 205[1:N] provides a compensated resistance between a corresponding node N1 and ground.

Turning first to compensation circuit 210, a reference voltage Vref is developed by a voltage divider that includes a PMOS transistor 211 and a series of polysilicon resistors. Transistor 211 is optional, and may be included to support a power-down mode. Asserting an active-low enable signal ENb turns transistor 211 on. Transistor 211 may behave non-linearly with changes in supply voltage and temperature, and so is made to have an on resistance that is low relative to the values of the associated polysilicon resistors. The preponderance of the resistance used to derive reference voltage Vref behaves relatively linearly, so the impact of the non-linearity of transistor 211 on voltage Vref is relatively small. Like transistor 211, a pair of NMOS transistors 212 and 213 are optionally included to support the power-down mode.

Feedback voltage Vfb is developed by a voltage divider similar to the one used to develop voltage Vref. This second voltage divider includes one fewer resistor, however, substituting one resistor for an NMOS transistor 214. An integrator 216 controls the voltage Vc' on the gate of transistor 214 to maintain feedback voltage Vfb equal to reference voltage Vref. All of the depicted resistors may be designated to be of equal value, in which case the resistance through transistor 214 is maintained equal to the resistance through one of the polysilicon resistors. The polysilicon resistors are relatively stable with changes over the expected ranges of temperature and supply voltage, so the resistance through transistor 214 is relatively constant.

The output of integrator 216 is coupled to the gate of transistor 214 via a transistor 218 and a current-mirror 220. These elements are included to compensate for compensation-voltage errors induced by similar circuitry employed to distribute control signals to the various resistors 205[1:N]. Voltages in general and compensation voltage Vc in particular, are not easily distributed without distortion. Control voltage Vc is therefore converted to a plurality of calibration currents Ical[1:N] using a set of transistors 222, each of which is identical to transistor 218. The N calibration currents Ical [1:N] are conveyed to corresponding ones of resistances 205 [1:N].

The compensated resistances 205[1:N] are identical, so only one resistance 205[1] is described. A current mirror 226 similar to current mirror 220 converts calibration current Ical1 into a compensation voltage Vcl'. Due to the identity or near identity of corresponding transistors 218 and 222 and corresponding current mirrors 220 and 226, control voltage Vcl' closely follows control voltage Vc' on the gate of transistor 214. Analog control voltage Vcl' and some digital select logic Sel[0:4] control an adjustable impedance 230 in the manner discussed above in connection with adjustable impedance 105 of FIG. 1.

Figure 3A:
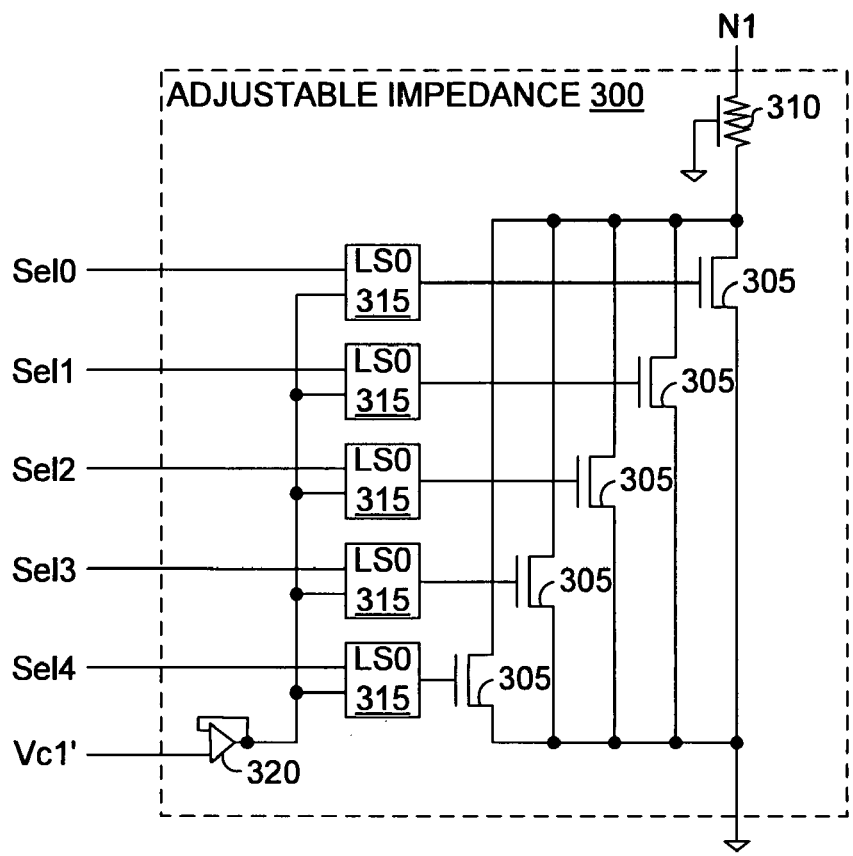
FIG. 3A depicts an exemplary adjustable impedance 300 that may be used in place of adjustable impedance 230 of FIG. 2 in accordance with one embodiment.

FIG. 3A depicts an exemplary adjustable impedance 300 that may be used in place of adjustable impedance 230 of FIG. 2 in accordance with one embodiment. Adjustable impedance 300 includes a plurality of parallel-coupled transistors 305, each of which extends between a pair of nodes, node N1 and ground, in series with an optional polysilicon resistor 310. The response of resistor 310 to voltage and temperature fluctuations is more linear than the response of transistors 305, so the inclusion of resistor 310 improves the linearity of the total resistance through adjustable impedance 300. The switches used to apply control voltage Vcl' to the gates of transistors 305 in response to select signals are level shifters 315 in this embodiment. An optional buffer 320 may be employed to meet the requirements of switching current consumed, for example, in the case where transistors 305 form impedance legs of an output driver.

Figure 3B:
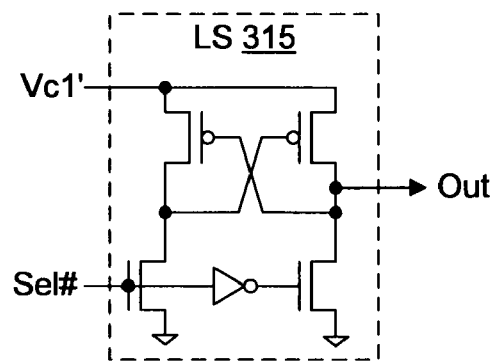
FIG. 3B depicts an example of level shifter 315 of FIG. 3A.

FIG. 3B depicts an example of level shifter 315 of FIG. 3A. Level shifters are useful as switches when, for example, the associated adjustable impedance operates at a different voltage level than the compensation circuitry. In some embodiments, adjustable impedance 300 is part of a termination element for a high-speed communication link for which the termination voltage Vtt may be greater than the core supply voltage Vdd. One such embodiment is discussed below in connection with FIG. 6. Level shifter 315 may be used to translate from an internal operating voltage of an integrated circuit device that uses a different operating voltage than an operating voltage used at the input/output (I/O) interface. For example, a transmitter of the IC may use a higher voltage to interface signals with other chips in a system. The transmitter may employ an output driver that uses adjustable impedance 300 as a controllable impedance output driver or an on-die termination. The level shifter translates internal signals that use first voltage levels to equivalent second voltage levels used in the transmitter.

Figure 4:
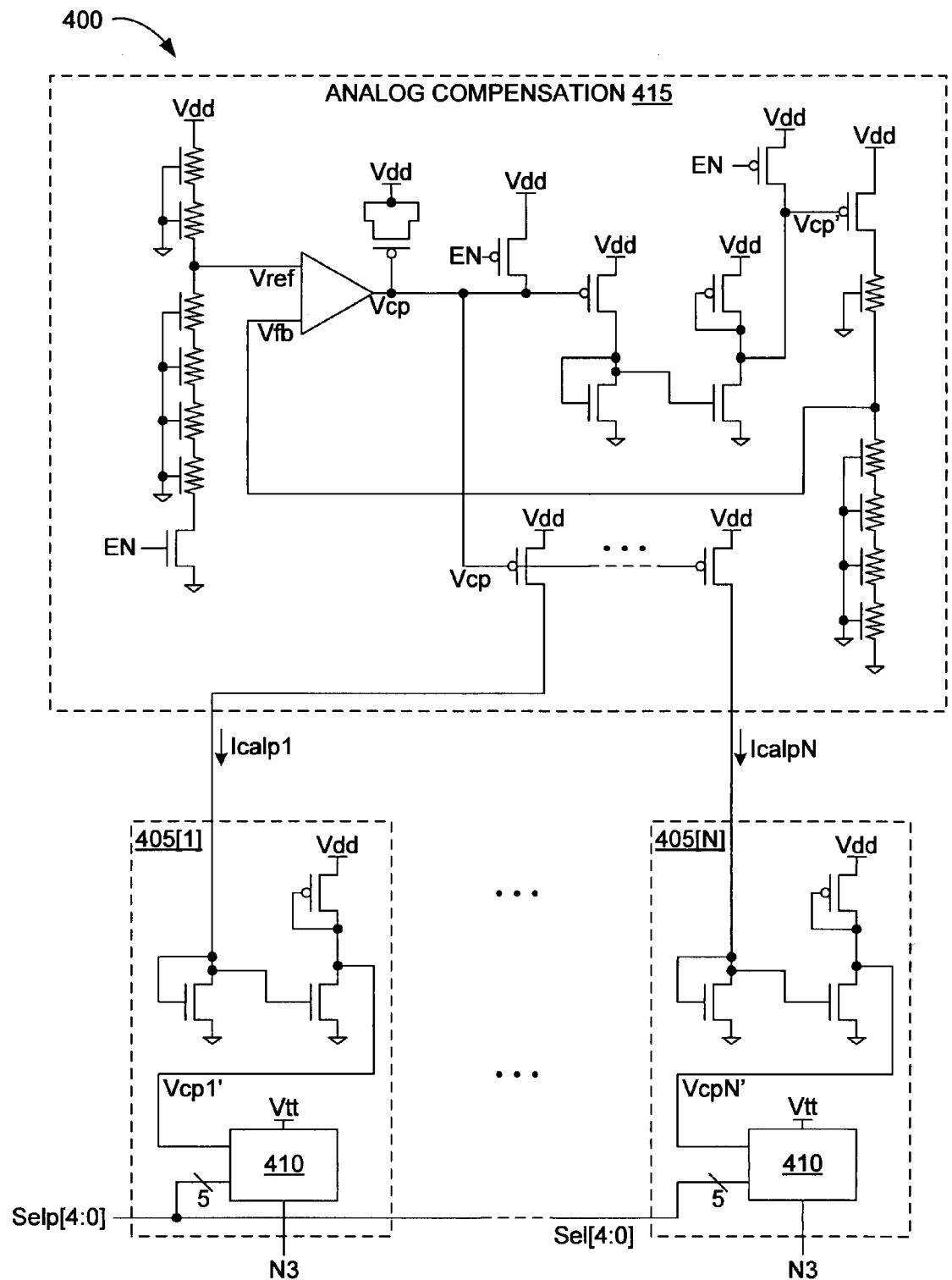
FIG. 4 depicts a system 400 of N compensated resistors 405[1]-405[N], each including an adjustable impedance 410, and an analog compensation circuit 415.

FIG. 4 depicts a system 400 of N compensated resistors 405[1:N], each including some adjustable impedance 410, and an analog compensation circuit 415. System 400 is essentially similar to system 200 of FIG. 2, except that system 400 provides calibrated resistances between a plurality of nodes N3 and a relatively high supply voltage Vtt using adjustable impedance 410. The operation of system 400 mirrors that of system 200, as will be evident to those of skill in the art, so a detailed discussion of system 400 is omitted here for brevity.

Figure 5:
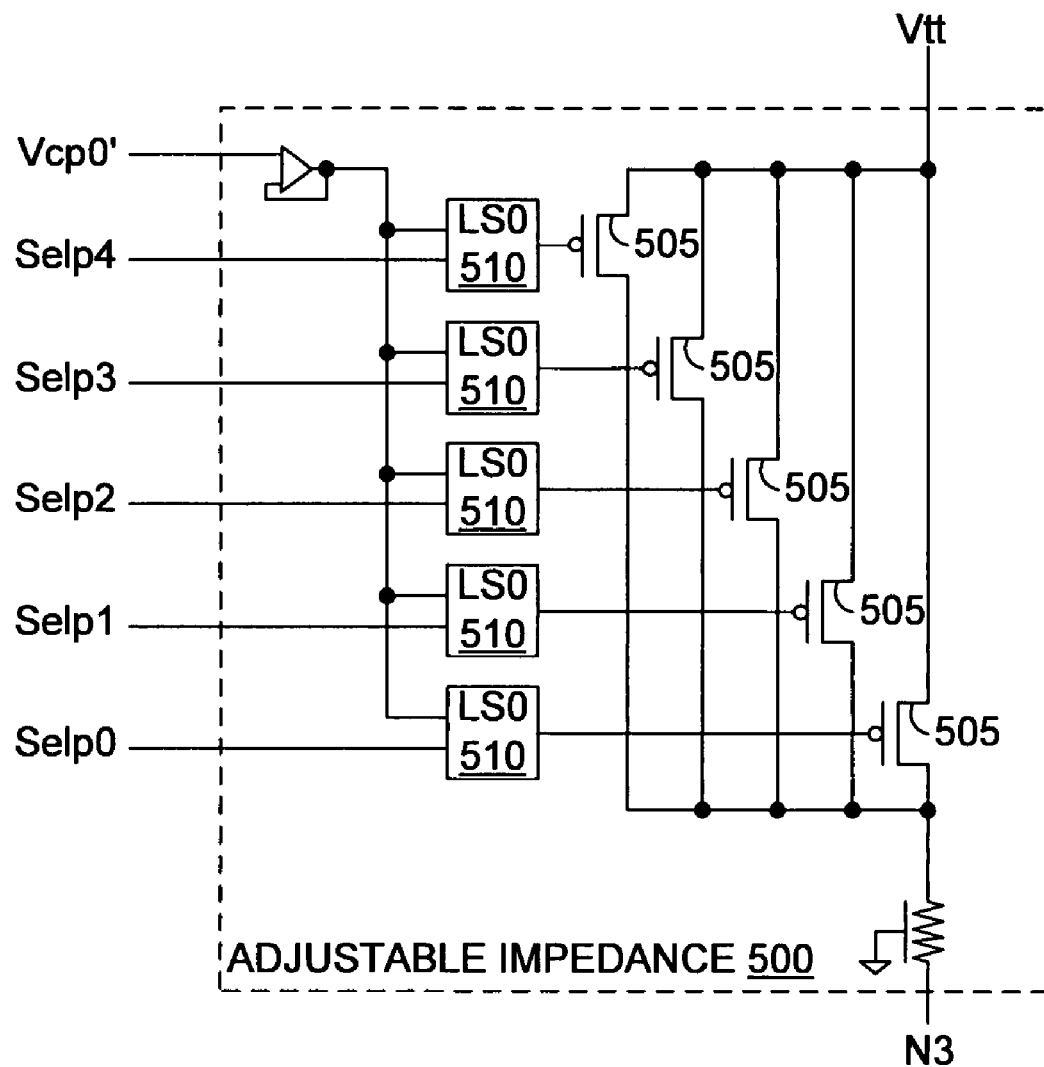
FIG. 5 depicts an embodiment of adjustable impedance 500 that can be used e.g. in place of adjustable impedance 410 of FIG. 4.

FIG. 5 depicts an embodiment of adjustable impedance 500 that can be used e.g. in place of adjustable impedance 410 of FIG. 4. Adjustable impedance 500 is similar to adjustable impedance 300 of FIG. 3A, but uses PMOS transistors 505 between supply voltage Vtt and a node N3. Adjustable impedance 500 employs level shifters 510 adapted to convey control voltage Vcp0' to the gates of transistor 505. Other types of switches are substituted for the level shifters in other embodiments.

Figure 6:
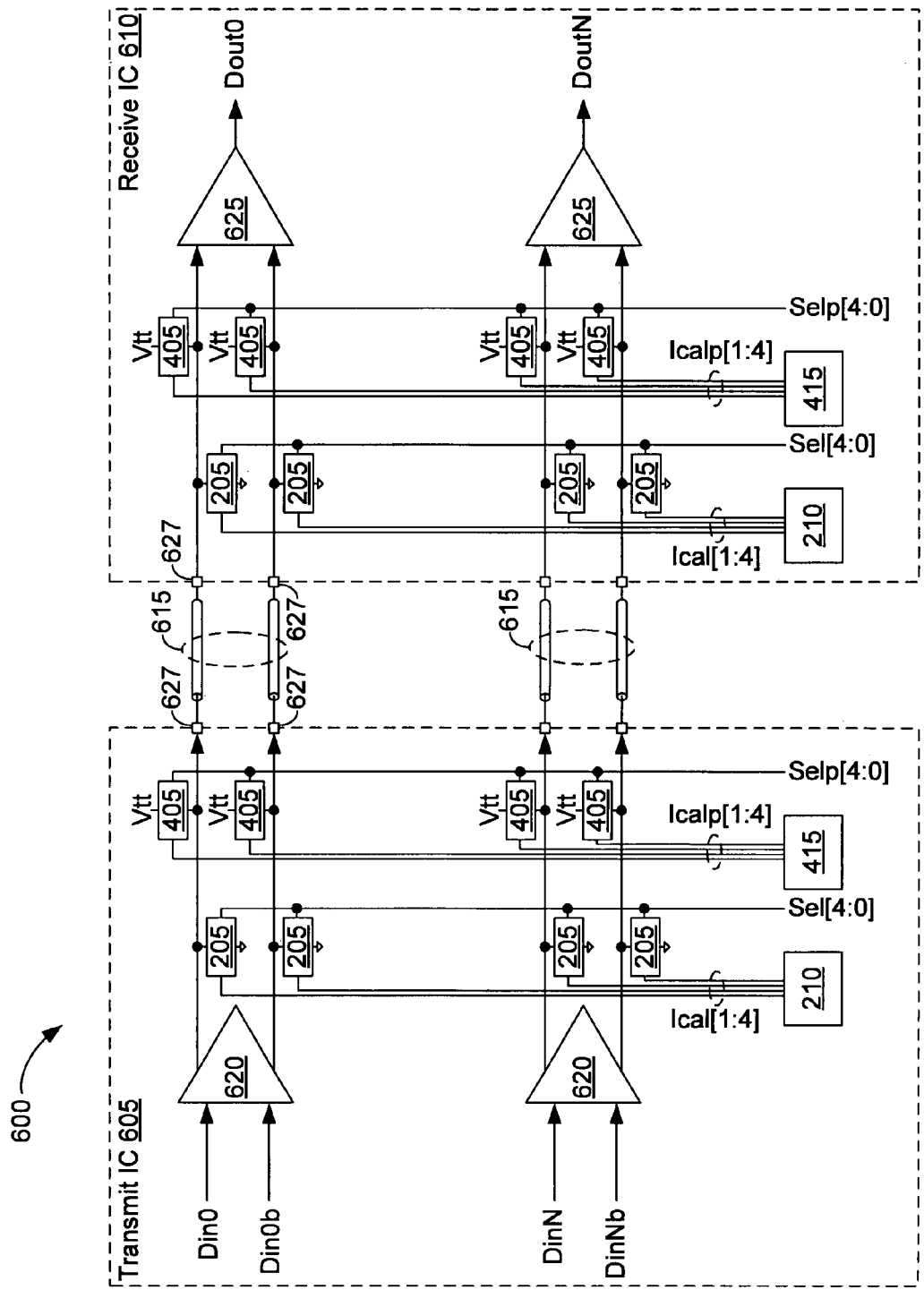
FIG. 6 depicts a communication system 600 that employs controllable resistances 200 and 400, detailed in respective FIGS. 2 and 4, to provide adjustable termination resistances for differential, high-speed communication channels.

FIG. 6 depicts a system 600 that employs systems 200 and 400, detailed in respective FIGS. 2 and 4, to provide adjustable termination resistances for differential, high-speed communication channels. Communication system 600 includes a transmit IC 605 coupled to a receive IC 610 via two differential communication channels 615 (for example, one or a plurality of signal lines). Differential transmitters 620 on IC 605 convey complementary signals Din/Dinb over corresponding channels 615, coupled via bonding pads 627, to differential receivers 625 on IC 610. Receivers 625 convert signals Din/Dinb into single-ended output signals Dout. In accordance with one embodiment, compensated resistors 205 and 400 are coupled between each signal line and respective voltage nodes ground and Vtt, and analog compensation circuits 210 and 415 and select lines Sel[0:4] and Selp[0:4] are included to control the controlled resistances. The termination resistances associated with each line of channels 615 can therefore be tuned to match the channel characteristics by adjusting the select signals as appropriate, to minimize the bit error rate of transmitted data for example. Due to the analog control, the selected termination resistances can be held relatively constant despite power-supply and temperature fluctuations. Termination elements can be used on the same die as one or both of the transmitters or receivers (collectively "communication circuits"), and more or fewer termination elements can be used on communication nodes coupled to a given single or multi-line channel. Further, system 600 can be implemented between IC dies within the same package, as between dies in a given system-in-a-package (SiP) or a multi-chip module configuration, or transmit IC 605 and receive IC 610 can be more remote. In a typical example, communication channels similar to those of FIG. 6 can be used to communicate between physical memory and a memory controller.

Figure 7:
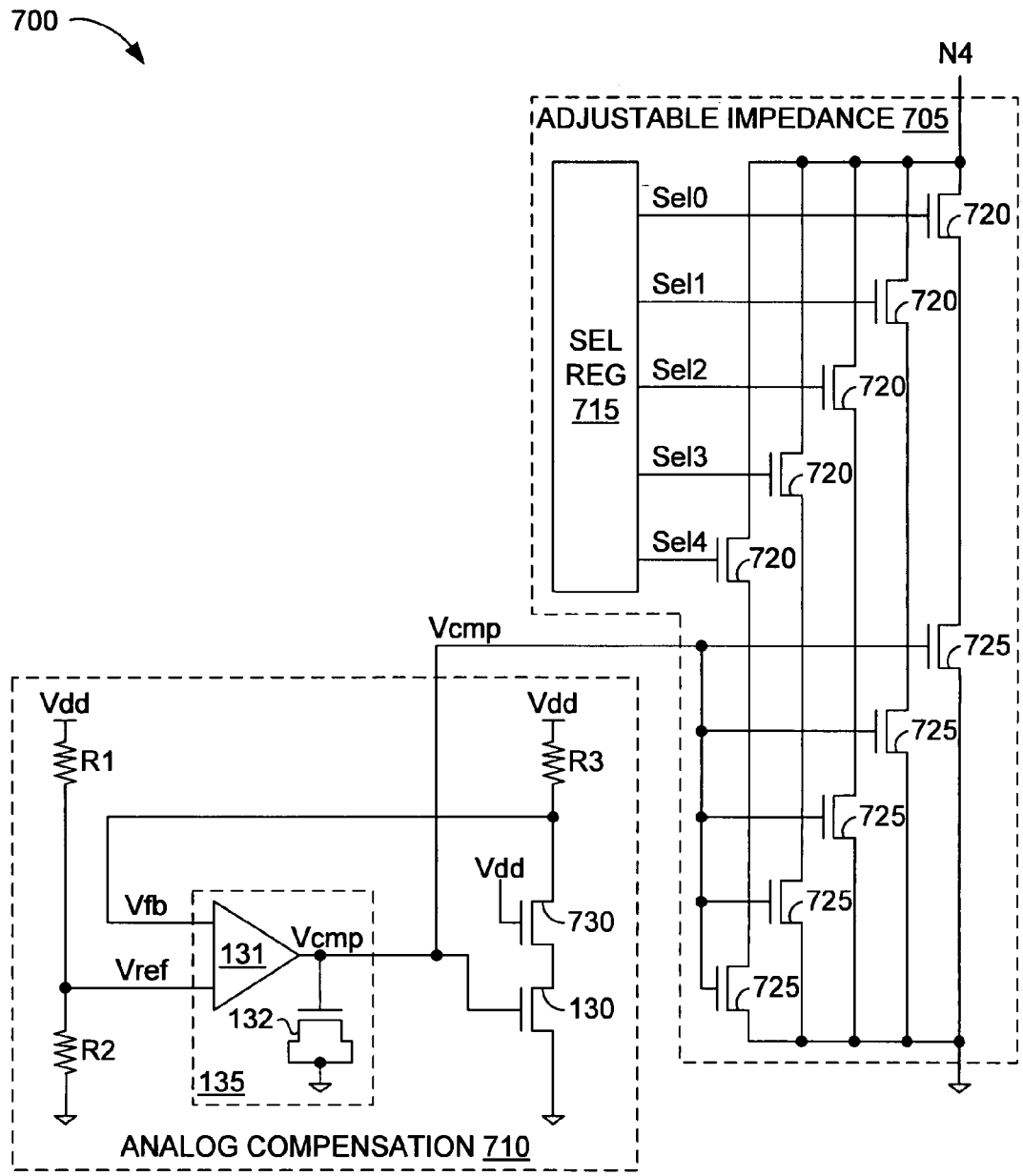
FIG. 7 depicts a system 700 that includes an adjustable impedance 705 and associated analog compensation circuitry 710.

FIG. 7 depicts a system 700 that includes an adjustable impedance 705 and associated analog compensation circuitry 710. Adjustable impedance 705 establishes a gross resistance between nodes N4 and ground in response to digital select signals Sel[0:4], from a select register 715 in this example. Select signals Sel[0:4] selectively enable one or a plurality parallel legs through impedance 705 by turning on selected ones of corresponding transistors 720. In one embodiment, select signals are either supply voltage Vdd or ground.

Each leg of impedance 705 includes a second transistor 725, the gate of which is coupled to a compensation voltage terminal Vcmp from compensation circuitry 710. By varying the control voltage to transistors 725, compensation circuitry 710 varies the impedance of selected legs, and consequently the impedance between nodes N4 and ground.

Analog compensation circuitry 710 may be similar to analog compensation circuitry 110, like-labeled elements being the same or similar in these examples. Compensation circuitry 710 additionally includes a transistor 730, or some other form of switch, coupled in series with transistor 130. Transistor 730 is similar to transistors 720 and is biased in the same manner as the enabled ones of transistors 720, the gates of which are coupled to a high supply voltage representative of a logic one in this embodiment. Each leg of impedance 705 therefore responds similarly to temperature and supply-voltage fluctuations as the combination of transistors 130 and 730. Feedback voltage Vfb is developed across both transistors 130 and 730, so comparator 131 maintains the voltage drop across those transistors equal to reference voltage Vref. The compensation voltage Vcmp derived to maintain feedback voltage Vfb equal to reference voltage Vref may be applied to the control terminals of transistors 725 to maintain relatively constant the impedance between nodes N4 and ground. Register 715 is depicted as part of impedance 705; it is to be understood, however, that register 715 can be shared among a plurality of adjustable impedances. The operation of system 700 is similar to the operation of system 100 of FIG. 1, so a detailed treatment of system 700 is omitted for brevity.

In the foregoing description and in the accompanying drawings, specific terminology and drawing symbols are set forth to provide a thorough understanding of the present invention. In some instances, the terminology and symbols may imply specific details that are not required to practice the invention. For example, signals described or depicted as having active-high or active-low logic levels may have opposite logic levels in alternative embodiments. As another example, circuits described or depicted as including metal oxide semiconductor (MOS) transistors may alternatively be implemented using bipolar technology or any other technology in which a signal-controlled current flow between current-handling terminals may be achieved.

An output of the design process for an integrated circuit, or a portion of an integrated circuit, may be a computer-readable medium (e.g., a magnetic tape or an optical or magnetic disk) encoded with data structures or other information defining circuitry that may be physically instantiated as an integrated circuit or portion of an integrated circuit. These data structures are commonly written in Caltech Intermediate Format (CIF) or GDSII, a proprietary binary format. Those of skill in the art of mask preparation can develop such data structures from schematic diagrams of the type detailed above.

While the present invention has been described in connection with specific embodiments, variations of these embodiments will be obvious to those of ordinary skill in the art. For example:

a. Termination elements are only one application for precise, stable resistances. Other applications for such resistances include low-offset-voltage operational amplifiers, precision voltage reference circuits, analog frequency tuning circuits, voltage-controlled oscillators, analog-to-digital and digital-to-analog converters, to name just a few.

b. The foregoing embodiments can employ any number of volatile and non-volatile memory technologies to provide the desired programmability for the various types of adjustable impedances.

c. Some components are shown directly connected to one another while others are shown connected via intermediate components. In each instance the method of interconnection, or "coupling," establishes some desired electrical communication between two or more circuit nodes, or terminals. Such coupling may often be accomplished using a number of circuit configurations, as will be understood by those of skill in the art.

Therefore, the spirit and scope of the appended claims should not be limited to the foregoing description. Only those claims specifically reciting "means for" or "step for" should be construed in the manner required under the sixth paragraph of 35 U.S.C. §112.

What is claimed is:

1. An integrated-circuit die comprising:
   a. a plurality of bonding pads to couple to respective ones of a plurality of communication channels and, for each bonding pad,
      i. a communication circuit coupled to the bonding pad, wherein the communication circuit is a transmitter or a receiver to transmit or receive a signal over the corresponding communication channel; and
      ii. a compensated resistor coupled between a termination voltage node and the bonding pad to exhibit a termination resistance, the compensated resistor including a select port to receive a digital select signal, an analog calibration port to receive an analog calibration signal, and a plurality of switches, wherein an analog compensation circuit is coupled to the control terminals via the switches and the switches comprise level shifters to adjust a level of the analog calibration signal; and
   b. the analog compensation circuit is coupled to each analog calibration port to deliver the analog calibration signal, wherein the analog calibration signal tunes the termination resistances of the compensated resistors to match characteristics of the corresponding communication channels.

2. The die of claim 1, wherein each compensated resistor includes a plurality of legs coupled in parallel between a reference terminal and the respective bonding pad, and wherein each leg includes at least one transistor having first and second current-handling terminals and a control terminal.

3. The die of claim 2, wherein the analog compensation circuit includes a comparator having a first input terminal coupled to a reference, a second input terminal coupled to a feedback node, and an output terminal coupled to the analog calibration ports.

4. The die of claim 2, wherein the analog compensation circuit is coupled to the control terminals via at least one current mirror.

5. The die of claim 1, wherein the analog compensation circuit includes a comparator having a first input terminal coupled to a reference, a second input terminal coupled to a feedback node, and an output terminal coupled to the analog calibration ports.

6. The die of claim 5, further comprising a plurality of current mirrors, wherein the output terminal is coupled to each analog calibration port via a respective one of the current mirrors.

7. The die of claim 1, wherein the analog calibration signal is a calibration current.

8. The die of claim 1, wherein each compensated resistor includes a plurality of legs coupled in parallel between a reference terminal and the respective bonding pad, and wherein each leg includes at least two series-connected transistors, each transistor having first and second current-handling terminals and a control terminal.

9. The die of claim 8, wherein the control terminal of one of the series-connected transistors is coupled to the analog calibration port and the control terminal of the other of the series-connected transistors is coupled to the select port.

10. The die of claim 1, further comprising a select register coupled to the select port and storing the digital select signal.

11. A system comprising:
   a. a plurality of compensated resistors, each compensated resistor including:
      i. a plurality of impedance legs coupled between the first and second nodes, each leg including at least one transistor having first and second current-handling terminals and a control terminal; and
      ii. a current mirror having a calibration-current input and a compensation-voltage output coupled to each of the control terminals; and
   b. an analog compensation circuit coupled to each calibration-current input; wherein the analog compensation circuit is coupled to each calibration-current input via a respective level shifter.

12. The system of claim 11, wherein the compensation circuit includes a comparator having a first input terminal coupled to a reference, a second input terminal coupled to a feedback node, and an output terminal coupled to the calibration-current input.

13. The impedance of claim 11, wherein each impedance leg includes a second transistor having a second control terminal to receive a digital select signal.

14. A method of calibrating a plurality of communication channels, the method comprising:
   a. providing at least one compensated resistor for each of the channels;
   b. distributing a digital select signal to each of the compensated resistors to adjust the termination impedances through the compensated resistors;
   c. generating an analog calibration signal;
   d. level shifting the analog calibration signal; and
   e. distributing the level-shifted analog calibration signal to each of the compensated resistors to adjust the termination impedances through the compensated resistors.

15. The method of claim 14, further comprising adjusting the level-shifted analog calibration signal responsive to changes in temperature.

* * * * *